United States Patent [19]

Keren et al.

[11] Patent Number: 5,544,071
[45] Date of Patent: Aug. 6, 1996

[54] CRITICAL PATH PREDICTION FOR DESIGN OF CIRCUITS

[75] Inventors: Doron Keren, Haifa; Igal Izsak, Yokjear; Iaacov Kobrinsky, Haifa, all of Israel

[73] Assignee: Intel Corporation, Santa Clara, Calif.

[21] Appl. No.: 174,729

[22] Filed: Dec. 29, 1993

[51] Int. Cl.⁶ .................................................. H01L 25/00
[52] U.S. Cl. ......................... 364/489; 364/490; 364/491; 364/578
[58] Field of Search ................................. 364/488, 489, 364/490, 491, 578

[56] References Cited

U.S. PATENT DOCUMENTS

| | | | |
|---|---|---|---|
| 4,924,430 | 5/1990 | Zasio et al. | 364/578 |
| 5,218,551 | 6/1993 | Agrawal et al. | 364/491 |
| 5,355,321 | 10/1994 | Grodstein et al. | 364/489 |
| 5,396,435 | 3/1995 | Ginetti | 364/489 |
| 5,416,718 | 5/1995 | Yamazaki | 364/488 |
| 5,432,707 | 7/1995 | Leung | 364/489 |

OTHER PUBLICATIONS

E. M. Clarke, J. R. Burch, O. Grumberg, D. E. Long and K. L. McMillan, *Automatic Verification of Sequential Circuit Designs*; Mechanized Reasoning and Hardware Design, 105–120 (1992).

E. M. Clarke, D. E. Long and K. L. McMillan, *Compositional Model Checking*; Proceedings. Fourth Annual Symposium on Logic in Computer Science, 353–362 (1989).

Z. Har'El and R. P. Kurshan, *Software for Analysis of Coordination*; Proceedings of International Conference on Systems, Science and Engineering, 382–385 (1988).

J. R. Burch, E. M. Clarke, and K. L. McMillan, *Symbolic Model Checking: $10^{20}$ States and Beyond*; 98 Information and Computation 2, 142–170 (1992).

P. J. Brumfitt, *MetaMorph—A Formal Methods Toolkit with Application to the Design of Digital Hardware*; 2 Journal of Functional Programming, 437–473 (Oct. 1992).

Douglas L. Perry, *VHDL*; Table of Contents and 223–326 (1994).

E. M. Clarke, D. E. Long and K. L. McMillan, *A Language for Compositional Specification and Verification of Finite State Hardware Controllers*; Computer Hardware Description Languages and their Applications, 281–295 (1990).

R. P. Kurshan, Member, ieee; and K. L. McMillan, *Analysis of Digital Circuits Through Symbolic Reduction*; 10 IEEE Transactions on Computer–Aided Design of Integrated Circuits and Systems 11, 1356–1371 (Nov. 1991).

Janaki Akella and Kenneth McMillan, *Synthesizing Converters between Finite StateProtocols*; International Conference on Computer Design: VLSI in Computers and Processors, 410–413 (1991).

B. Billard; *Improving Verification Tools*, 12 Journal of Electrical and Electronics Engineering 3, 248–256 (Sep. 1992).

P. Gutwin, P. McGeer & R. Brayton, *Delay Prediction for Technology Independent Logic Equations*, 1992 IEEE International Conference on Computer Design: VLSI in Computers & Processors, 468–471, (Oct. 1992).

(List continued on next page.)

*Primary Examiner*—Kevin J. Teska
*Assistant Examiner*—Stephen J. Walder, Jr.
*Attorney, Agent, or Firm*—Blakely, Sokoloff, Taylor & Zafman

[57] ABSTRACT

An automatic method of critical path prediction in a computer system used with a network model representative of a circuit. Gate delays are determined for each cell used for each of the drivers in the combinational block. Load delays are also determined for each cell used for each of the drivers in the combinational block. Estimated delays may then be determined for each path between each of the drivers in the combinational block and sinks coupled to each of the drivers in the combinational blocks. Static timing analysis on the combinational block is performed by using the gate delays, the load delays, and the estimated delays to determine estimated required times and total capacity for each primary output of the sinks of the combinational block, and to determine estimated arrival times for each primary input of the drivers of the combinational block.

9 Claims, 9 Drawing Sheets

OTHER PUBLICATIONS

M. C. Golumbic, *Combinatorial Merging*, C-25 IEEE Transactionson Computers, 11, 1164–1167 (Nov., 1976).

D. Wallace, M. Chandrasekhar, *High Level Delay Estimation for Technology–Independent Logic Equations*, 1990 IEEEInternational Conference on Computer–Aided Design, 188–191 (Nov. 1990).

N. Weiner, A. Sangiovanni–Vincentelli, *Timing Analysis In A Logic Synthesis Environment*, 1989 ACM/IEEE Design Automation Conference, 655–661 (Jun. 1989).

R. Brayton, R. Rudell, A. Sangiovanni–Vincentelli, A. R. Wang, *MIS: A Multiple–Level Logic Optimization System*, CAD–6 IEEE Transactions on Computer–Aided Design of Intergrated Circuits and Systems 6, 1062–1081 (Nov. 1987).

Bill Brykczynski, David A. Wheeler, *An Annotated Bibliography on Software Inspections*; 18 SIGSOFT—Software Engineering Notes 1, 81–88 (Jan. 1993).

Hojat et al., "SYSTAT: A System Levet Timing Verifier", Circuits and Systems, 1990 IEEE Midwest Symposium, 1991, pp. 323–326.

Devadas et al., "Statistical Timing Analysis of Combinational Circuits", Computer Design—ICCD '92 Int. Conf., 1992, pp. 38–43.

Devadas et al., "Delay Computation in Combinational Logic Circuits: Theory and Algorithms Computer–Aided Design", 1991 Int. Conf., 1991, pp. 176–179.

Chang et al., "An Accurate and Efficient Gate Level Delay Calculators for MOS Circuits", Design Automation Conf., 1988, pp. 282–287.

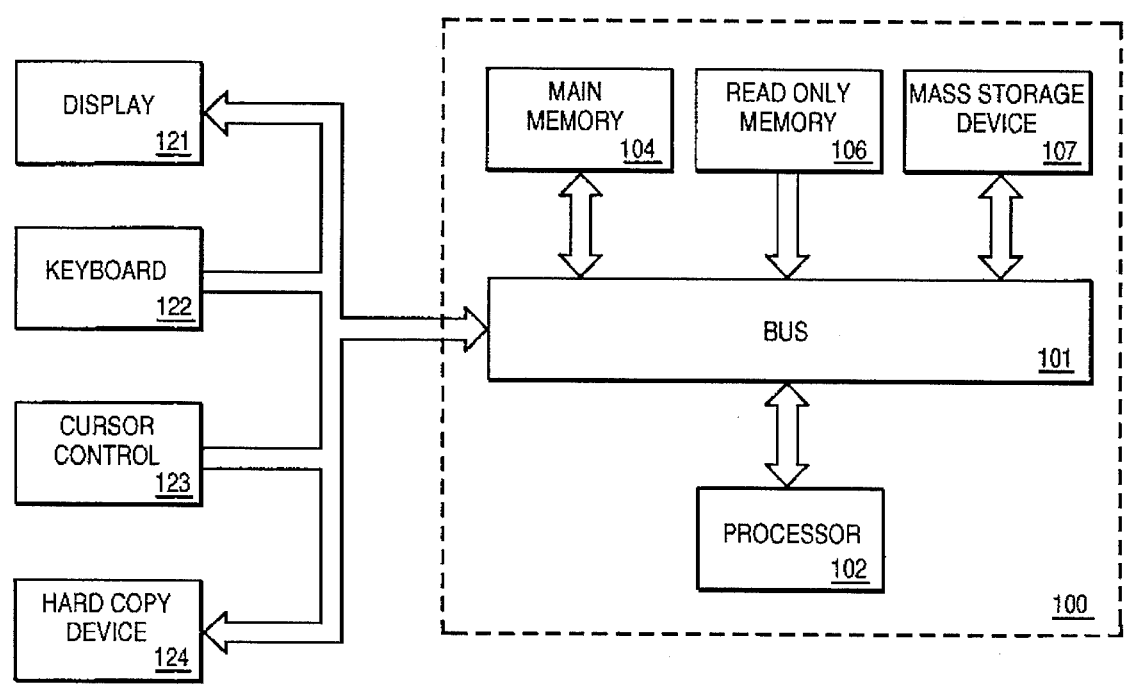
FIG_1

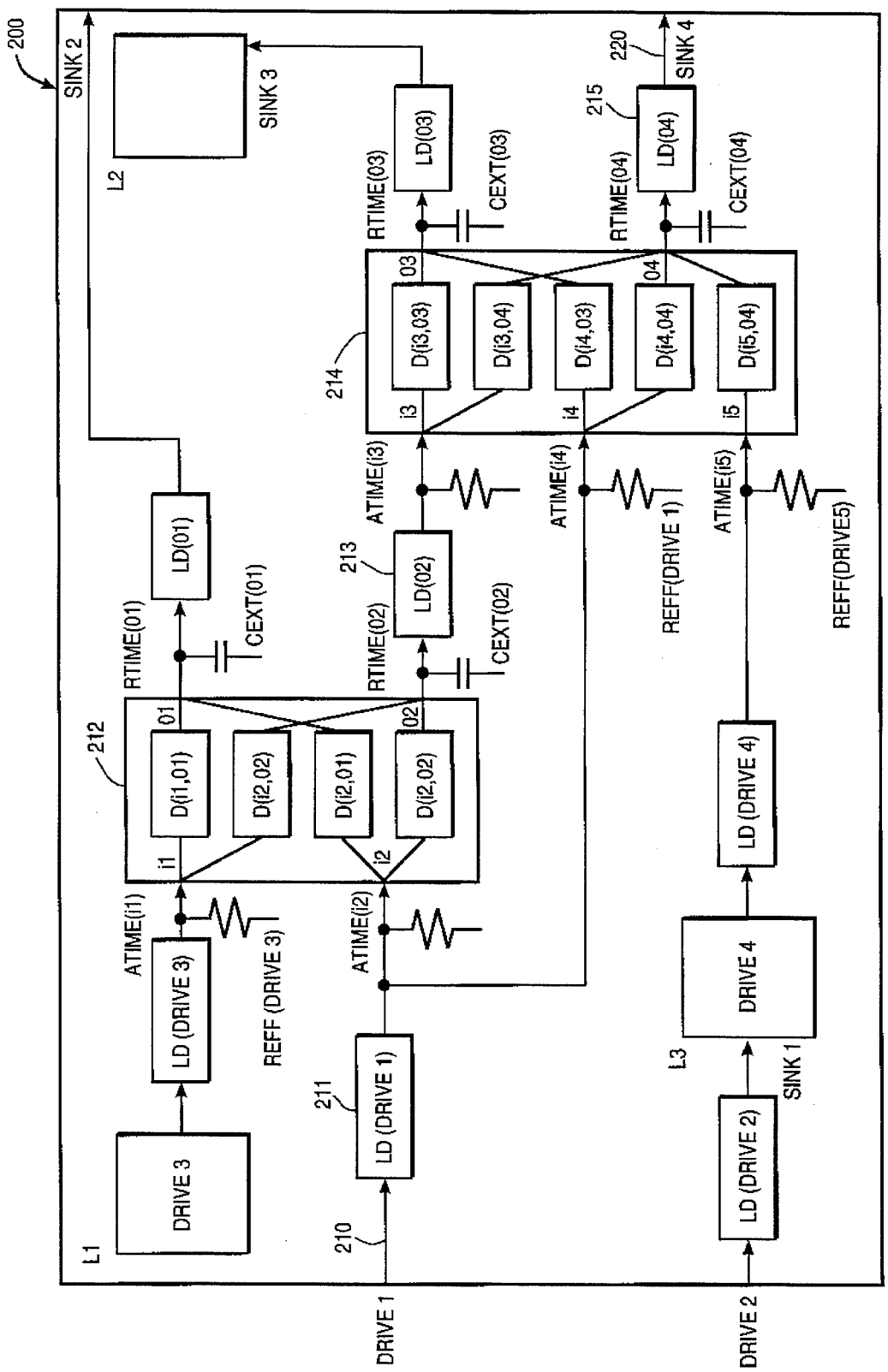
FIG_2A

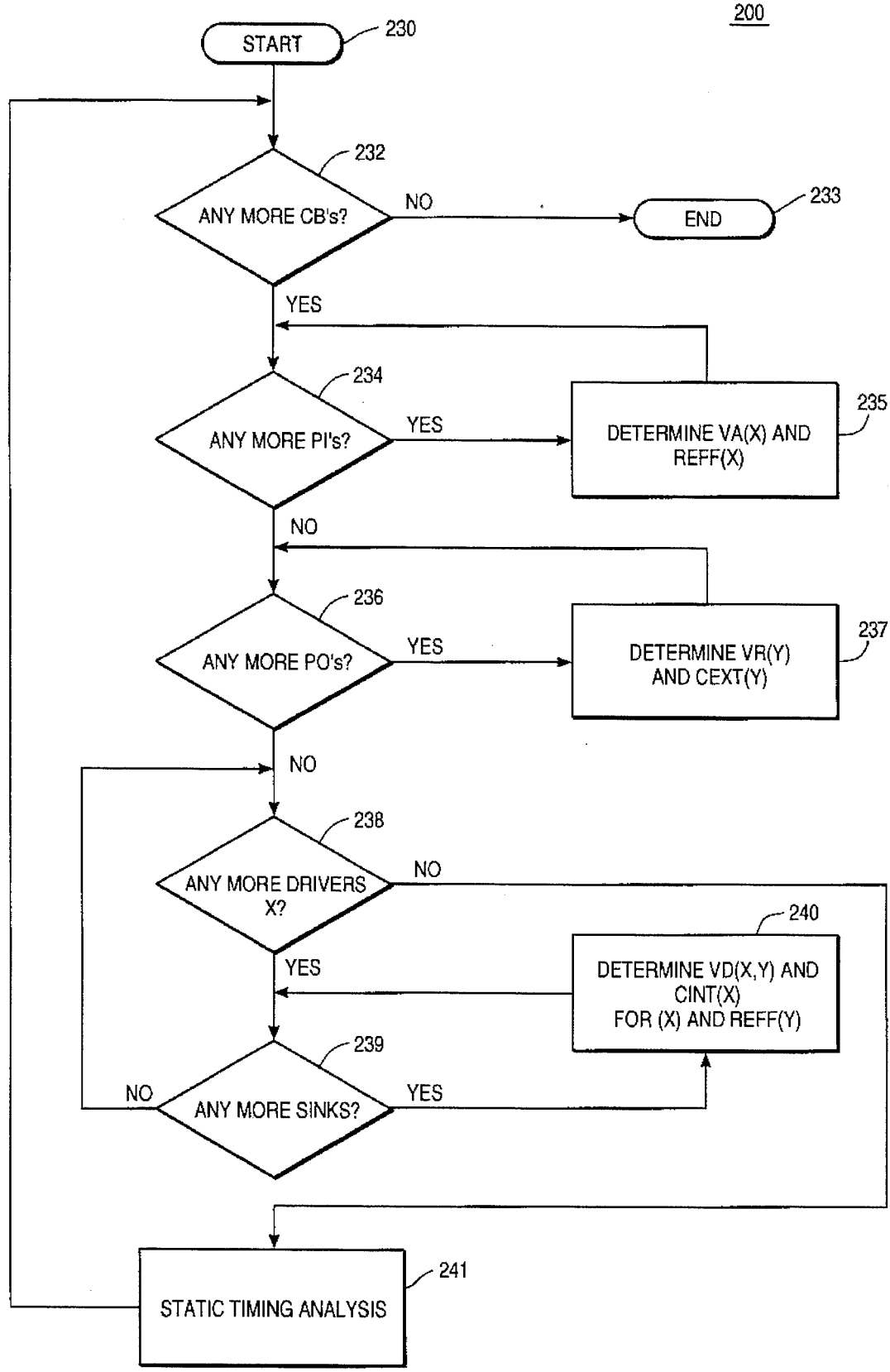
FIG_2B (PRIOR ART)

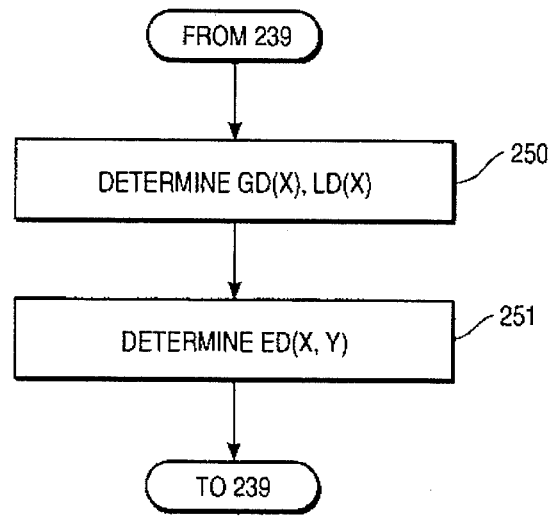
FIG_2C
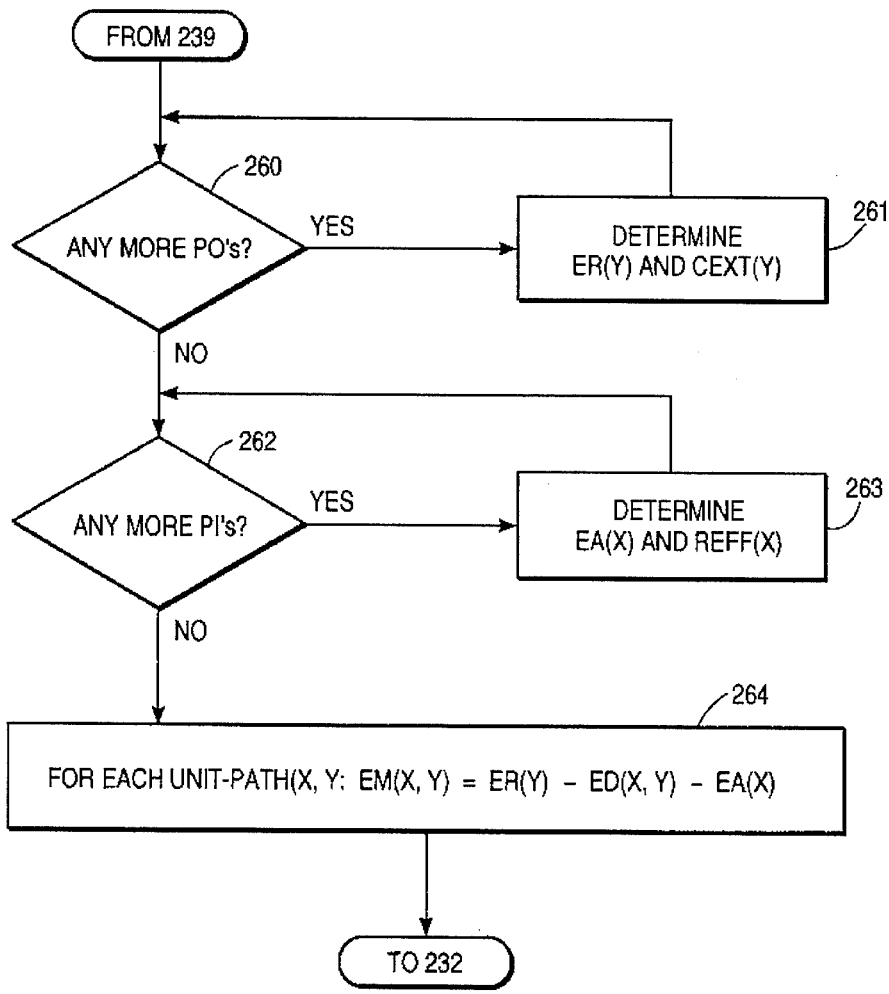
FIG_2D

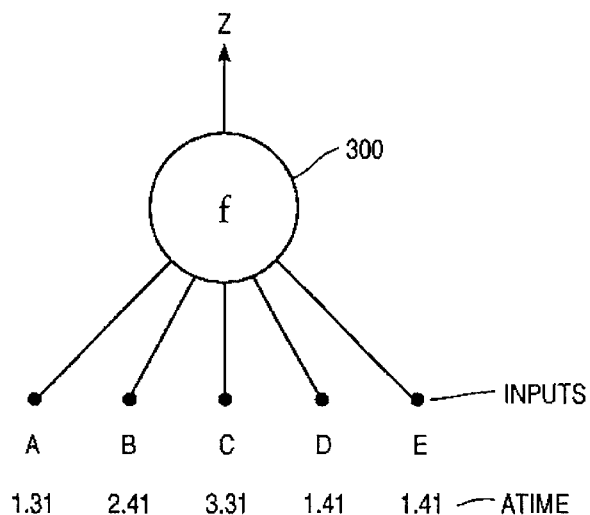
FIG_3
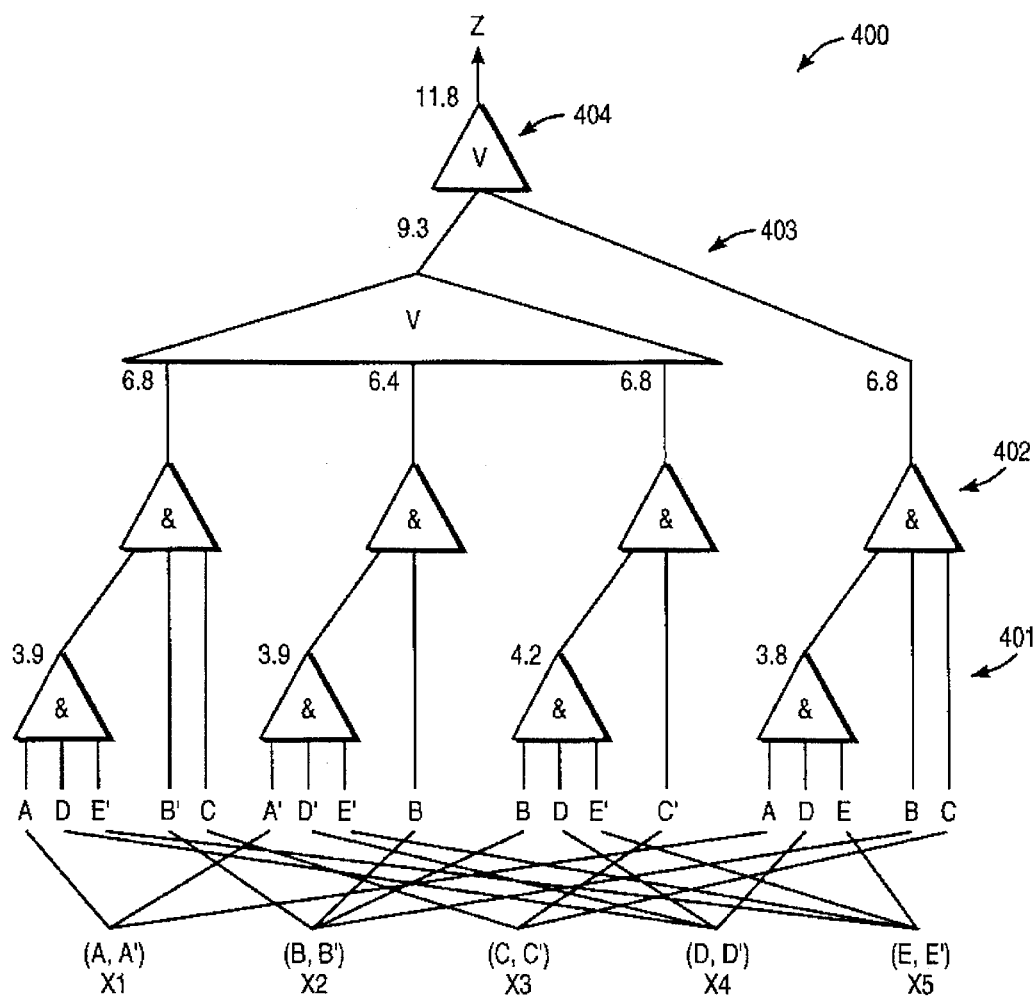
FIG_4

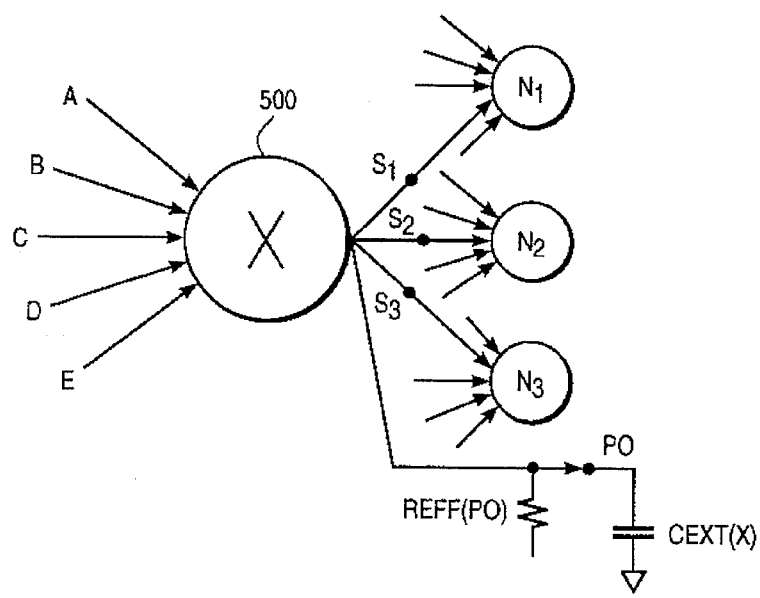
FIG_5A
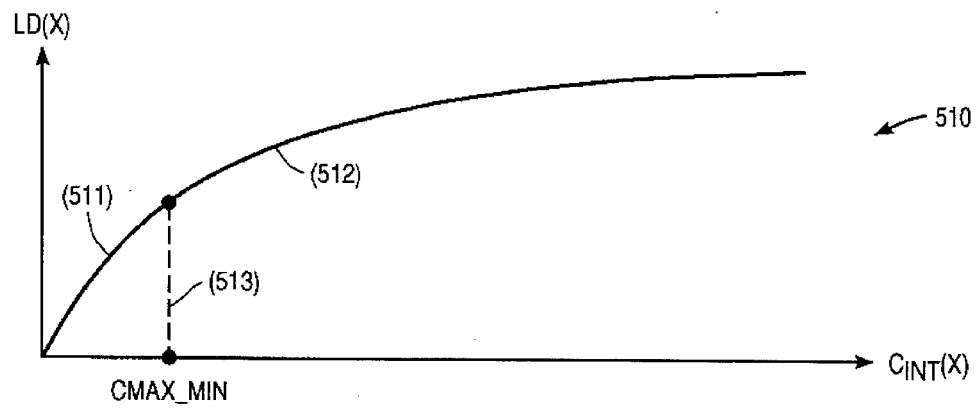
FIG_5B
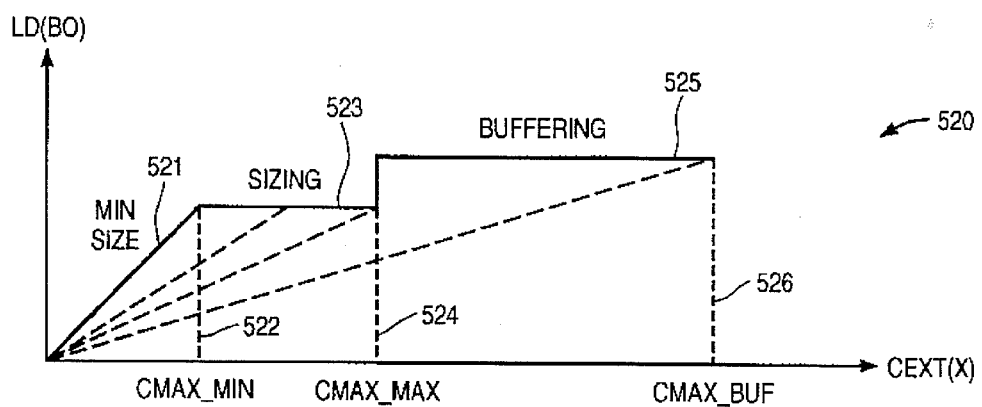
FIG_5C

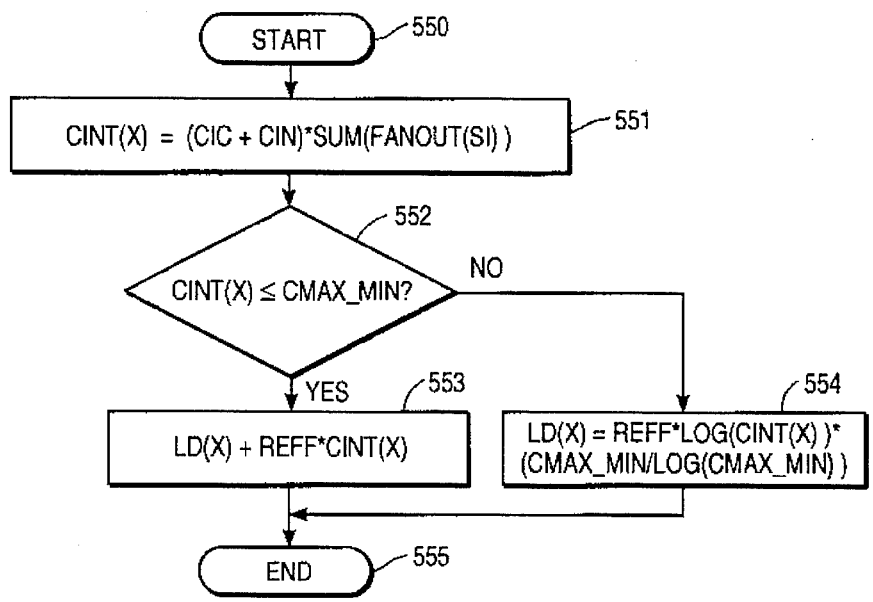
FIG_5D LD(X) ESTIMATIONS
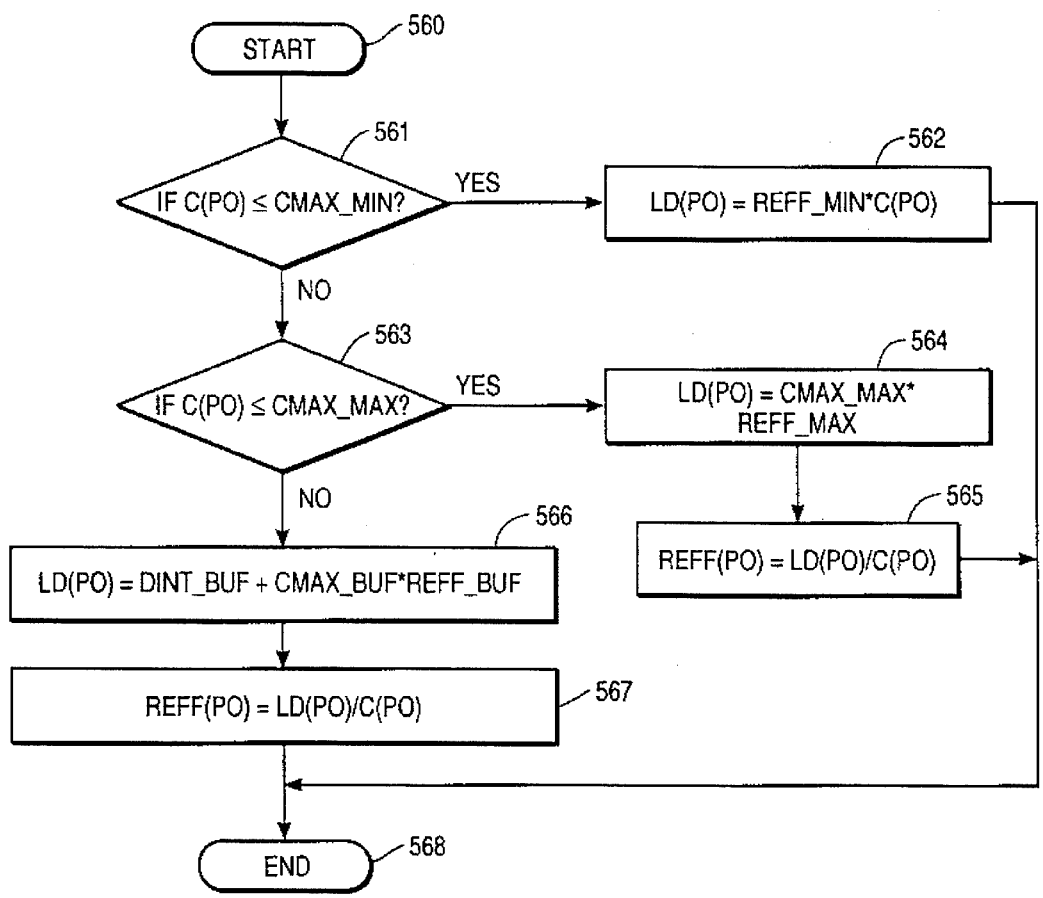
FIG_5E LD(PO) ESTIMATION

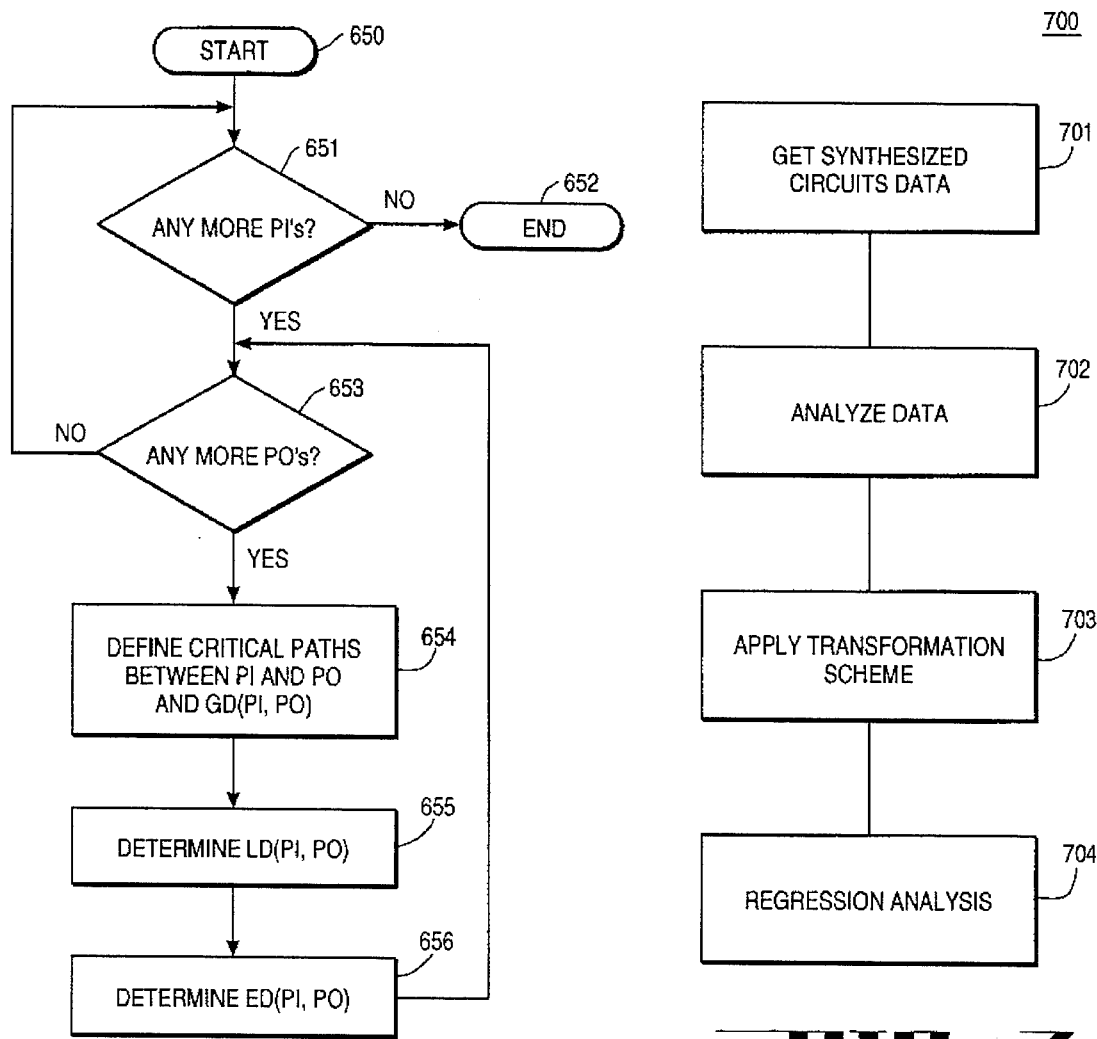

CRITICAL PATH PREDICTION FOR DESIGN OF CIRCUITS

BACKGROUND OF THE INVENTION

1. Field of the Invention

The present invention relates to the design of circuits. More specifically, the present invention relates to automated tools for predicting the performance of circuitry.

2. Background Information

As very large scale integrated circuits (VLSI) designs have grown increasingly complex, the modeling of the circuit has shifted to the new high-level hardware description languages or HDL's. One example of an HDL is known as "VHDL" or VHSIC Hardware Specification Language IEEE Standard 1076–1987). See, Perry, VHDL, (Second Ed. 1993). HDL's typically use a modeling scheme known as a register transfer level (RTL) description which is an abstraction used in chip design to model the various flows of paths through a circuit. Although such modeling techniques are very powerful tools for designing modem circuits, such as integrated circuits, the HDL or RTL design neglects to take into account very large propagation delays for generating individual signals in the circuit. Therefore, after a complete design of a functioning HDL model, the HDL designer must later provide performance optimization to insure generation of the signals at the most appropriate intervals. Such signal optimization typically is performed after design of the HDL model, and is typically solved using manual redesigns of the block in question. As a results, performance problems, such as long propagation delays in generating certain signals, are discovered later after the logical synthesis of the blocks in the circuit, and typically entail a redesign of the RTL and even higher levels of the design. This results in costly circuit and layout redesigns, which is a large waste of time and effort.

Therefore, what is needed is the estimation of delays of signals due to propagation delays of other signals upon which those signals are dependent, at early stages of the design. Moreover, it is important that these estimations be as fast as possible and enable fast turnaround times for the HDL developer.

SUMMARY AND OBJECTS OF THE PRESENT INVENTION

One of the objects of the present invention is predict propagation delays in a circuit design prior to layout and logical synthesis of a hardware description language (HDL) of a circuit design.

Another of the objects of the present invention is to predict the propagation delays in critical paths of an integrated circuit.

Another of the objects of the present invention is to predict delays of combinational logic before logical synthesis of a circuit design model.

Another of the objects of the present invention is to overcome the shortcomings of prior an methods of predicting propagation delays in a circuit such as those used for sequential logic synthesis.

These and other objects of the present invention are provided for by an automatic method of critical path prediction in a computer system for a network model representative of a circuit. The following steps are performed for each combinational block in the network model. Gate delays are determined for each cell used for each of the driven in the combinational block. Load delays are also determined for each cell used for each of the drivers in the combinational block. Then, estimated delays are determined for each path between each of the drivers in the combinational block and sinks coupled to each of the drivers in the combinational blocks. Finally, a static timing analysis on the combinational block is performed by using the gate delays, the load delays, and the estimated delays to determine estimated required times and total capacitance for each primary output of the sinks of the combinational block, and to determine estimated arrival times for each primary input of the drivers of the combinational block. Critical paths may then be determined early in a circuit's design, prior to logical synthesis in one embodiment, identifying timing problems in a circuit (e.g. integrated circuit), which may then be corrected to avoid costly and time-consuming re-designs of the circuit.

Other objects, features and advantages of the present invention will be apparent from viewing the figures and the description which follows below.

BRIEF DESCRIPTION OF THE DRAWINGS

The present invention is illustrated by way of example and not limitation in the figures of the accompanying in which like references indicate similar elements and in which:

FIG. 1 shows a computer system upon which one embodiment of the present invention may be implemented.

FIG. 2a illustrates drivers and sinks for a particular combinational block upon which one embodiment of the present invention may be used to perform critical path prediction.

FIGS. 2b–2d illustrate methods used for critical path prediction.

FIG. 3 illustrates a single gate which is used for performing gate delay calculations in one embodiment of the present invention.

FIG. 4 illustrates a Huffman Tree representation of a gate in order to calculate various timing estimations of signals through the gate.

FIGS. 5a–5e illustrate graphical representations of performing load delay estimations of drivers and a specified number of sinks.

FIGS. 6a and 6b shows a graphical representation of a model for a combinational block and a delay estimation method using load delays and gate delays for each of the drivers and sinks of a particular combinational block.

FIG. 7 illustrates a summary of a method used for performing a statistical model of the combinational block to determine its critical paths.

DETAILED DESCRIPTION

Figure 6A:
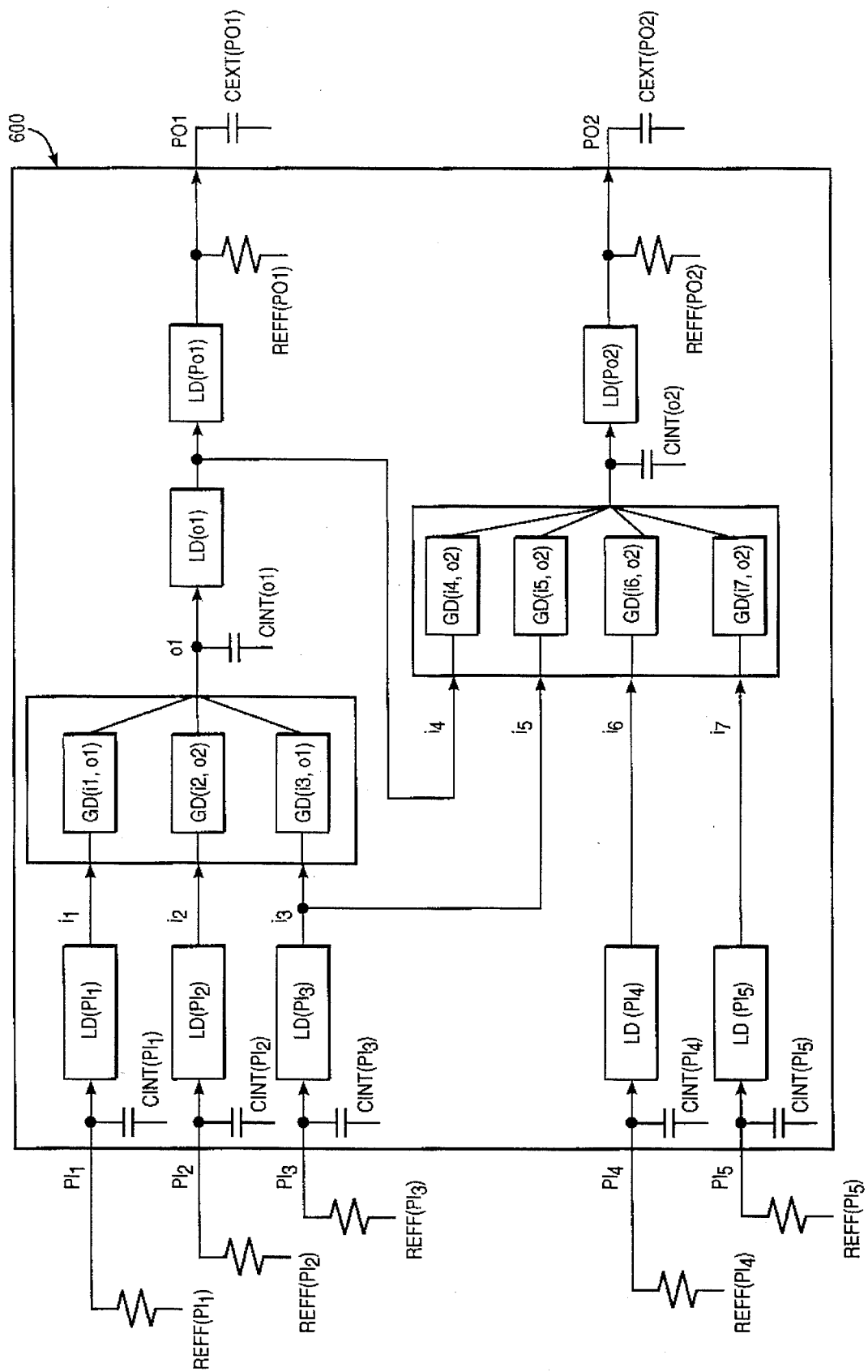

A mechanism for determining the critical paths in a circuit design is described. In the following description, for the purposes of explanation, very specific embodiments are set forth describing specific signals, representations of circuits, method steps, timings, etc., in order to provide a thorough understanding of the present invention. It will be apparent to one skilled in the art, however, that the present invention may be practiced without some of the specific details. In other instances, well known circuits and certain types of models of such circuits are shown in block diagram form in order to not unnecessarily obscure the present invention.

Referring to FIG. 1, a system upon which one embodiment of the present invention is implemented is shown as 100. 100 comprises a bus or other communication means 101 for communicating information, and a processing means 102 coupled with bus 101 for processing information. System 100 further comprises a random access memory (RAM) or other volatile storage device 104 (referred to as main memory), coupled to bus 101 for storing information and instructions to be executed by processor 102. Main memory 104 also may be used for storing temporary variables or other intermediate information during execution of instructions by processor 102. Computer system 100 also comprises a read only memory (ROM) and/or other static storage device 106 coupled to bus 101 for storing static information and instructions for processor 102, and a data storage device 107 such as a magnetic disk or optical disk and its corresponding disk drive. Data storage device 107 is coupled to bus 101 for storing information and instructions. Computer system 100 may further be coupled to a display device 121, such as a cathode ray tube (CRT) or liquid crystal display (LCD) coupled to bus 101 for displaying information to a computer user. An alphanumeric input device 122, including alphanumeric and other keys, may also be coupled to bus 101 for communicating information and command selections to processor 102. An additional user input device is cursor control 123, such as a mouse, a trackball, stylus, or cursor direction keys, coupled to bus 101 for communicating direction information and command selections to processor 102, and for controlling cursor movement on display 121. Another device which may be coupled to bus 101 is hard copy device 124 which may be used for printing instructions, data, or other information on a medium such as paper, film, or similar types of media. Note, also, that any or all of the components of system 100 and associated hardware may be used in various embodiments, however, it can be appreciated that any configuration of the system may be used for various purposes as the user requires.

In one embodiment, computer system 100 can be an IBM-compatible type personal computer such as those commercially available. Processor 102 can be one of the 80×86 family of microprocessors, such as the Intel 80386 or 80486 manufactured by Intel Corporation of Santa Clara, Calif.

Note that the following discussion of various embodiments discussed herein will refer specifically to a series of routines which are generated in a high-level programming language (e.g., the C++language available from Symantec of Cupertino, Calif.) and compiled, linked, and then run as object code in system 100 during run-time. These routines may be used in conjunction with other design tools, such as the set of circuit tools available from Synopsys, Inc. of Santa Clara, Calif., although any logic synthesis tools may be used. It can be appreciated by one skilled in the art, however, that the following methods and apparatus may be implemented in special purpose hardware devices, such as discrete logic devices, large scale integrated circuits (LSI's), application-specific integrated circuits (ASIC's), or other specialized hardware. The description here has equal application to apparatus having similar function.

Presentation of a Network

A sequential circuit (unit) consists of combinational logic blocks and latches. For example, a unit U is modeled with a directed graph G(U)={V(U),E(U)}, where V(U) is the set of nodes and E(U) is the set of wires (or edges) connecting the nodes. Each primary input (PI) and primary output (PO) of the unit, combinational block or latch is represented by a distinct node that belongs to V(U). Each wire of the unit is represented by an edge that belongs to E(U).

A combinational block (CB), is a multi-level logic network consisting of the gates, PI and PO. For each gate, a Boolean function is defined. So, by analogy to the unit, a combinational block CB is modeled with a directed graph G(CB)={V(CB),E(CB)} wherein each PI, PO, gate input and gate output is represented by a distinct node that belongs to V(CB) and each wire of CB is represented by an edge that belongs to E(CB).

Signals and Delay Models

In implemented embodiments of the present invention, signals that are assigned to each primary input (PI) latch outputs and gate outputs ate defined as "Drivers" and signals that are assigned to each primary output (PO), gate inputs and latch inputs are defined as "Sinks." For each driver (X) a non-zero DELAY is defined that contains two pans. One is a load delay LD(X) that is equal to Reff(X)*Cout(X), where Cout(X) is the total capacitance that is driven by the driver (X). In the case of a linear delay model, Reff is constant, but it is assumed that Reff is the function of Cout: this dependency reflects the set of transformations (sizing, buffering, duplication, splitting) that provide driver adjusting to a set of different loads. LD(X) is assigned to all edges that are connected to the output of driver (X). The second measurement which is used in various embodiments of the present invention is known as a gate delay GD(X) which is defined for driver X that is the combinational block, gate output which includes the set of delays between gate inputs and gate outputs. Both LD(X) and GD(X) estimations are found prior to a synthesis process which is typically performed upon a model used for representing a circuit design, as in well-known prior an techniques. Various types of delay models are discussed below.

Timing

Timing for a whole defined unit and for each combinational block CB in a circuit is defined prior to performance of the various embodiments of the present invention. For each driver X that is a primary input PI or latch output, the values Reff and arrival time Atime(X) are defined. Atime(X) is the moment at which the signal X becomes stable and can be obtained from a separate tool applied to the RTL description. Second, for each sink(Y), that is a primary output or a latch input, the values Cext and required time Rtime(Y) are specified. Rtime(Y) is the moment at which the signalY is required to be valid in order to meet various circuit timing specifications (for example, before capturing the edge of a clock).

Definition of Path Delays

The combinational block path CB-path(X,Y) from driver X to sink Y is the sequence of nodes and edges that belong to G(CB) starting from X and ending on Y. A delay of CB-path(X,Y) is defined as the sum of driver delays (LD's and GD's) that belong to the CB-path(X,Y). D(X,Y) is the delay of the longest CB-path(X,Y).

A unit path from driver X to sink Y is a sequence of nodes and edges that belong to V(U) starting from X and ending at Y. Delay D(X,Y) of a Unit-path is defined as the sum of driver delays and delays of the longest CB-paths that belong to the Unit-path. An example of a Unit-path delay calculation is shown in FIG. 2a. A unit path (X,Y) is defined as a "critical path" if the margin (X,Y)=Rtime(Y)−D(X,Y)−

Atime(X) is less than zero (negative). That is, the required time for the signal is less than the expected arrival time and delay time caused by the circuit. Thus, if margin (X,Y) is less than zero, then the signal must arrive at least that much earlier in order to meet defined timing specifications.

For example, as illustrated with reference to the combinational block illustrated as 200 in FIG. 2a, a path for delay calculation from driver 1 illustrated as a primary input line 210 in the unit 200, to sink 4 illustrated as a primary output of the unit 200 at line 220, may be calculated as follows:

$$D(\text{drive } 1, \text{sink}4) = LD(\text{drive } 1) + LD(04) + \text{Max}(D(i2, 02) + LD(02) + D(i3, 04), D(i4, 04))$$

wherein the total delay D(X,Y) is equal to the maximum of all Unit-path delays from the driver to the sink. Therefore, the load delay line to drive 1211 is added to the delay due to sink 215 as illustrated in FIG. 2a. To calculate the total delay D(drive 1, sink4) the maximum of the two path delay values (one that includes the sum of load delay value retrieved from logic block 212 (LD(02)) shown as 213 in FIG. 2a; another that includes CB-path delay D(i4, 04)) is added. Thus for the example of drive 1 at line 210 to sink 4 at line 220 illustrated in FIG. 2a, the total margin is calculated as follows:

$$\text{Margin}(\text{drive } 1, \text{sink}4) = R\text{time}(\text{sink}(4)) - d(\text{drive } 1, \text{sink}4) - A\text{time}(\text{drive } 1)$$

In summary, all pairs (drivers, sinks) of the Unit 200, illustrated in FIG. 2a, are marked by "+" with reference to Table 1.

TABLE 1

|  | Sink 1 | Sink 2 | Sink 3 | Sink 4 |
| --- | --- | --- | --- | --- |
| Driver 1 | – | + | + | + |
| Driver 2 | + | – | + | + |
| Driver 3 | – | + | + | + |
| Driver 4 | – | – | – | + |

Thus, for any of the corresponding drivers shown as rows, and the sinks shown as columns associated in table 1 with each of the drivers, if the margin is negative, then the path is considered "critical" and adjustments must be made in order to insure that appropriate timing for these critical paths is minimized. The details of performing this operation will be discussed below.

Summary of Critical Path Prediction

Certain prior art tools for sequential logic synthesis start from a multi-level logic minimization followed by an iterative process that performs the following steps on each iteration: (1) generation of timing environment for each combinational block from the known timing environment of the unit including, for each PI(X)–valid arrival time VA(X) and Reff(X); for each PO(Y)–valid required time VR(Y) and total capacitance Cext(Y) that is external to CB and is connected to (Y); (2) Combinatorial synthesis of each CB, including multi-level logic minimization, mapping and timing/area improvement, using timing environment defined on the previous iteration. The result of combinatorial synthesis is a behavioral characterization of each CB that includes: valid delay VD(X,Y) for each CB-path(X,Y) total,capacitance Cint(X) that is internal to CB and is connected to (X) and Reff(Y)-Reff of the driver that is connected to (Y); and (3) Static timing analysis of the unit to update the timing environment for each combinational block CB and the iteration process is repeated from step 1. This process is briefly summarized with reference to FIG. 2b.

For example, a typical prior art automatic process of sequential logic synthesis is illustrated with reference to process 200 of FIG. 2b. Such a process may start at a typical process entry point e.g., 230 of FIG. 2b. Then it is determined whether there are any more combinational blocks, and if not, the process ends at 233, a typical process exit point. Then, at step 234, it is determined whether there are any more primary inputs to the combinational block. If so, then the valid arrival time VA(X) and Reff(X) is determined at step 235, and this process continues until there are no more primary inputs PI. At step 236 it is determined whether there are any more primary outputs. If so, then at step 237 the valid required time VR(Y) and the total capacitance Cext(Y) that is external to the combinational block and connected to Y is determined at step 237. This process continues until there are no more primary outputs to be calculated as determined at step 236. Then, at step 238 combinatorial synthesis of each combinational block including multi-level minimization, mapping and timing/area improvement using timing environment defined on the previous iteration using well-known prior an techniques. The results of the combinatorial synthesis is a behavioral characterization of each combinational block that includes a calculation of a valid delay VD(X,Y), for each CB path (X,Y) and total capacitance Cint(X) that is internal to CB and is connected to (X) and Reff(Y) the Reff of the driver that is connected to (Y). This is all determined at steps 238–240. Once there are no more drivers as detected at step 238, then static timing analysis of the unit may be performed at step 241 in order to determine the timing environment for each combinational block in the system and the iteration process continues to repeat at step 232. The Static timing analysis is performed at step 241 using well-known prior an techniques.

In certain implemented embodiments of the present invention certain steps of the prior an process discussed with reference to FIG. 2b are replaced with new processes in order to increase the performance of the timing analysis over prior art sequential logic synthesis methods. For example, as is illustrated in FIG. 2c, step 240 may be replaced by steps 250 and 251 illustrated in FIG. 2c. For example, instead of determining the valid delay VD(XY) for each CB path(X, Y), implemented embodiments of the present invention use special models for estimation of GD(X) (the gate delay for the driver), LD(X) (load delay of driver X), and an estimated delay ED(X, Y) for each path X, Y in the combinational block. Thus, steps 250 and 251 may replace step 240 of FIG. 2b.

In addition, in other implemented embodiments of the present invention, the static timing analysis of the unit may be used to determine, for each primary output PO(Y), updated values of the estimated required time ER(Y) and total capacity CextCY). This is illustrated with reference to steps 260 and 261 which may be executed within an automatic process at block 241 shown in FIG. 2b. This is illustrated with reference to FIG. 2d. Moreover, for each primary input PI(X) the estimated arrival time EA(X) and Reff(x) may be calculated at steps 262 and 263 as illustrated in FIG. 2d. Finally, for each predicted unit path(X, Y) in the combinational block, may be characterized by an estimated margin EM(X,Y)=ER(Y)–ED(X, Y)–EA(X). This is illustrated at step 264 of FIG. 2d. Then, the process may return to step 232 of FIG. 2b to determine whether there are any more combinational blocks to determine the delays for. A more detailed discussion of these various processes will now be discussed.

Critical Path Delay Estimation

For a simple gate e.g., Gate 300 of FIG. 3 having inputs a-e and an output Z a Truth Table of a boolean function for z may be illustrated with reference to table 2 below.

TABLE 2

| | Truth Table (f) | | | | | |
|---|---|---|---|---|---|---|
| inputs | a | b | c | d | e | z |
| cube 1 | 1 | 0 | 1 | 1 | 0 | 1 |
| cube 2 | 0 | 1 | — | 0 | 1 | 1 |
| cube 2 | — | 1 | 0 | 1 | 0 | 1 |
| cube 2 | 1 | 1 | 1 | 1 | 1 | 1 |

The truth table of the Boolean function $z=f(x1, x2, \ldots xN)$ that is defined for the gate. For each input xi, wherein $i<=1<=N$:

$$\text{Atime}(xi) = \max\{\text{Atime}(PI) + ED(PI, xi)\}$$

wherein the maximum is taken on the set of the combinational block primary inputs. Thus, as is illustrated in FIG. 3, for each gate, each of the primary inputs to the gate have a defined arrival time Atime. Atime on a primary input may be obtained in a number of ways—by predefinition or as an output from another computer-aided design tool.

Also, using the standard cell library, (e.g., that available under IEEE standard 1164). The following parameters may be defined:

1. MAX_FAN_IN—maximum number of simple cell inputs (wherein simple includes a simple Boolean gate or cell having one of the Boolean functions AND, OR, NAND or NOR);
2. Del_int—the average internal delay of a medium size simple cell;
3. Reff—average Reff of a medium size simple cell; and
4. Cout—output capacity of a medium size simple cell.

A gate delay model in implemented embodiments of the present invention uses this data to find for each gate input (xi) the value GD(z,xi)—the Gate Delay from input 'xi' to output 'z' "that is defined recursively: 1) If $z=\text{AND}(x1,x2,\ldots,xk; k<=\text{MaxFANIN})$, i.e. Truth Table of (z) contains at least one cube (a product in a Boolean function) with length that is more than MaxFANIN, then this cube is presented as an 'AND-tree' (maybe unbalanced) with root that corresponds to (z), leaves that corresponds to {xi } and each internal node that corresponds to an AND function with no more that MaxFANIN inputs; gd(z,xi) is defined as the weighted length of the path and of an AND-tree from (xi) to (z) with a weight that is equal to del_lev (del—lev is an average delay due to passing through each level of a combinatorial block); 3) If a Truth Table of (z) contains more than one cube, then $z=\text{OR}(y1, y2, \ldots, ym)$, where yj are cubes; for each pair (yj, xi) the value gd(yj,xi) is defined as the length of the path from (xi) to (yj); OR is presented as an 'OR-tree' with a root that corresponds to (z), leaves that corresponds to {yj} and each internal node that corresponds to an OR function with no more than MaxFANIN inputs; gd(z,yj) is defined as the weighted length of the path of an OR-tree from (yj) to (z); gd(z,xi) is defined as $\text{MAX}(gd(z, yj) + gd(yj, xi))$ where MAX is found on the set of {yj}that belongs to the path from (xi) to (z).

Huffman Trees are used in implemented embodiments of the present invention to find a tree-presentation of the Truth Table of the Boolean function $z=f(xi, x2, \ldots, xn)$ that provides minimum value of $\text{Atime}(Z)=\text{MAX}(\text{Atime}(xi)+gd(z, xi))$. The following algorithm is used: 1) For each cube (yj) find a Huffman Tree with weights of the leaves that are equal to $\text{Atime}(xi)+gd(yj, xi))$; 2). Find a Huffman Tree with weights of the leaves that are equal to Atime(xi) that provide minimum value of $\text{Atime}(Z)=\text{MAX}(gd(z,yj)+\text{Atime}(yj))$. An example of a Huffman Tree presentation of a gate such as illustrated as z FIG. 3 is shown on FIG. 4.

As is shown in FIG. 4 generally there may exist more than one Huffman Tree with the given weights of the leaves. Each level of the tree is the traversal within the combinatorial block of an internal gate. The Huffman Tree is found that provides minimum number of critical paths that passes the root. The complexity of finding a Huffman Tree is estimated as $N * \log(N)$, where N is the number of leaves.

As illustrated in FIG. 4, each of the gates in the combinational block may be illustrated by a level (e.g., 401–404) in the Huffman Tree, all of these levels 401–404 being associated with a weight. Therefore, in order to determine the value of Atime(yj) a particular Huffman Tree illustrated as 400 in FIG. 4, the following value needs to be determined in an implemented embodiment of the present invention:

$$\text{Atime}(z) = \max(\text{Atime}(xi) + gd(z, xi))$$

Thus, the total value of Atime of the gate represented as 400 in FIG. 4 will be 11.8 units. This is due to adding Atime defined for x3, to the number of levels traversed by x3(number of levels=3) multiplied by the average delay (del_lev=2.5) for each level in the Huffman Tree 400 for the signal xi. This is determined as follows:

$$= \text{Atime}(x3) + gd(z, x3)$$

$$= 4.3 + 7.5$$

$$= 11.8$$

where:

$$\begin{aligned} gd(z,x3) &= \#\text{levels}(z, x3) * del\_lev \\ &= 3 * 2.5 = 7.5. \end{aligned}$$

Thus, the total propagated Atime for the gate z is equal to 11.8 library units in the illustrated embodiment. Note that other propagated signal gate delays may be calculated in a similar manner such as at each of the intermediate levels 401–403 illustrated. For example, at level 403, Atime=4.3+(2*2.5)=9.3 Also note that Atime(xi) for each signal may be predefined by a user or, in one implemented embodiment, is determined by a synthesis tool applied to the logic prior to the performance of the gate delay calculations performed here. The method described here poses a substantial improvement over the prior an which requires the determination of actual delays and actual timing for each signal path—a costly and complex process.

Load Delay Estimation

Another useful measurement for critical path prediction is determination of the load delay(s) for a combinatorial block. The load delay (LD) is a delay estimation of the driver that is connected to a specified number of sinks. It is difficult to determine the appropriate load delay because various electrical parameters are typically only known about the circuit after mapping and performance improvement performed on the circuit. Thus, it is important to estimate the load delay.

As one example, a driver(X) may be connected to a number of internal gates of a combinational block CB and to PO (e.g., 501 of FIG. 5). This is illustrated with reference to a gate 500 as shown in FIG. 5a. The total load (capacitive) of the gate C(X) 500 is equal to Cint(X)+Cext(X), where Cint(X) is the internal pan of the load due to connections between the driver and internal gates and Cext(X) is the external part of the load that is calculated during static timing analysis of the unit. Cint(x) is estimated by summarizing the loads of the sinks (s1, s2, . . . , sk) 502–504 that are connected to (X). Each sink 502–504, being an input of the gate, is associated with a corresponding input variable of the Truth Table for the gate. To estimate C(si), the load of (si), the function Fanout(si) from a standard library (e.g., the IEEE 1164 standard library) is set equal to the number of appearances of the variable si and its inversion in the Truth Table. As one example, the Fanouts of the inputs of the gate illustrated in FIG. 3, are shown in FIG. 5a as elements 502a–c, and 504a–c. If the Fanout of a sink is equal to 1, then its load is estimated by (Cic+Cin) where Cin is the average input capacity of a medium size simple cell and Cic is an average interconnection capacitance. Both parameters are obtained from a standard cell library. Thus, Cint(X), the internal capacitance of the circuit, is estimated as follows:

$$Cint(x)=(Cic+Cin)*SUM (Fanout(si))$$

where SUM is taken on the set of sinks that are connected to the driver(X).

The internal load capacitance Cint(X) is used for the load delay estimation LD(X). If Cint(X) is less than an implementation-dependent threshold (in this particular embodiment Cmax_min—the maximum load that a minimum size simple gate with the maximum number of Fanin inputs as drivers), then the dependency is linear. Otherwise, the dependency is assumed to be logarithmic. A process used for performing estimations of LD(X) is illustrated with reference to FIGS. 5b and 5d. For example, the process may start at typical process entry point 550 and the internal capacitance may be determined by the estimation Clint(X)=(Cic+Cin) * SUM (Fanout(si)) at step 551. Then, at step 552, it is determined whether the internal capacitance Cint(X) is less than or equal to Cmax_min. If so, then, the load delay estimation is performed at step 553 by calculating LD(X)= Reff*Cint(X), which is a linear relationship. This is illustrated with reference to region 511 of FIG. 5b. If, however, Cint(X) is larger than Cmax_min, as detected at step 552, then the process proceeds to step 554 wherein the load delay for the driver(X) is calculated by determining:

$$LD(X)=Reff*log(Cint(X))*(Cmax\_min/log(Cmax\_min)$$

Then, upon completion of either of these load delay estimations, the process may return at step 555, a typical process exit point. The function between the estimation of LD(X) and Cint(X) is illustrated with reference to plot 510 of FIG. 5b. Note that prior to the threshold Cmax_min for Cint(X), the relationship between Cint at (X) and LD(X) in region 511 is linear. After the threshold 513 illustrated on plot 510, the relationship becomes logarithmic in region 512.

If the driver X 500 of FIG. 5a is a primary input of the combinational block CB, then Reff is determined by static timing analysis of the unit using a typical prior art tool. If the driver X 500 is the output of an internal gate then Reff= Reff_min, the Reff of a minimum size simple gate with MaxFANIN inputs. If the driver X is connected to a primary output (PO) of a combinational block CB, then C(PO) is the load of PO that is equal to Cext(X), the external capacitance of CB. Thus, the load delay LD(X) is produced by Cext(X). Although LD(PO) may be determined using the steps illustrated in FIG. 5d, the load delay of the primary output is determined in implemented embodiments using the process steps illustrated in FIG. 5e. In this instance, a step function is used for the LD(X) estimation which conforms to the plot illustrated as 520 in FIG. 5c. For example, as illustrated in FIG. 5e, a process to determine LD(PO) of a combinational block may start at a typical process entry point such as 560 in FIG. 5e. Then, it may be determined whether the capacitance of the primary output C(PO) is less than or equal to Cmax_min, (the external capacitance is less than or equal to the threshold 522 illustrated in plot 520 of FIG. 5c). Thus, the load delay for the primary output falls along the portion of the curve 521 illustrated in FIG. 5c. In this instance, the load delay of the primary output LD(PO)=Reff_min*C(PO) at step 562 illustrated in FIG. 5e. Then, the process proceeds to a return, at a typical process exit point (e.g., step 568) in FIG. 5e.

If, however, the capacitance of the primary output C(PO) is less than or equal to the maximum capacity for a gate with maximum Fanin inputs Cmax_max but greater that Cmax_min, as detected at step 563, then the load delay is approximated at step 564 by determining LD(PO)=Cmax_max*Reff_max. Thus, the load delay of the primary output falls somewhere along the portion of the curve 523 illustrated in FIG. 5c, that is, wherein Cext(X) is between Cmax_min and Cmax_max. Then, at step 565 illustrated in FIG. 5e, the Reff of the primary output Reff(PO)=LD(PO)/ C(PO) is calculated. Thereafter, at step 568, the process may be returned from at a typical process exit point.

In all other cases, the load delay LD(PO) will be estimated based on the calculations shown at step 566 in FIG. 5e because the external capacitance Cext(X) falls between Cmax_max and Cmax_buf. This is illustrated in plot 520 as the region 525 between thresholds 524 and 526. Thus, the load delay will be estimated to be at the level 525 illustrated on plot 520. This is set according to step 566 in FIG. 5e. In FIG. 5e, the load delay for the primary output (PC)) is set equal to Dint_buf+Cmax_buf*Reff_buf. That is, the load delay will be based upon the Dint_buf (the internal delay of a maximum size buffer), Reff_buf (the Reff of a maximum size buffer), and Cmax_buf (the maximum permissible load of a maximum size buffer). Subsequently, at step 567, the Reff for the primary output Reff(PO) is set equal to the load delay LD(PO)/C(PO). Then, the process may exit at step 568, a typical process return or exit point.

Combinational Block Path Delay Estimation

Finally, the estimated values of LD(PI), LD(X), GD(X), and LD(PO) as discussed above are used together for determining estimates of the critical path delay ED(PI, PO) for each pair PI, PO of the CB. This is illustrated with reference to FIGS. 6a and 6b. For example, in the combinational block 600 illustrated in FIG. 6a, the process illustrated in 6b may be used to find each of the accumulated estimated delays ED(PI, PO) for each pair (PI, PO) of the combinational block illustrated as 600 in FIG. 6a. Determination of the estimated delay ED(PI, PC)) is illustrated with reference to FIG. 6b. For example, the accumulated gate delay GD(PI,PO) is determined of each critical path of each primary inputs and primary outputs PI, PC) (e.g., 601 to 660, 601 to 670, etc.) This is determined at step 654, and is done by using the above method of determining critical paths (those with negative margins between the primary inputs and primary outputs), wherein weight gd(X, xi) is assigned to each edge from gate input (xi) to gate output (X) and the weight 0 is assigned to all edges from drivers (PI, outputs of the gates) to the sinks (gate inputs, PO). Then, the accumulated load delay LD(PI, PO) of critical paths for each pair (PI, PO) is done at step 655 by applying the same algorithm to G(CB) in which weight zero is assigned to all edges from gate inputs to gate outputs, weight LD(PI) is assigned to each edge from PI to its sinks, weight LD(PO) is assigned to the edge from PO's driver to PO and LD(X) to each edge from the gate output (X) to its sink. Finally, the estimation of the critical path delay (ED(PI, PO)) is determined from the regression equation:

$$ED(PI, PO)=R(LD(PI),GD(PI,PO),LD(PI,PO),LD(PO))$$

which is performed at step 656 of the process illustrated in FIG. 6b, that is produced by the statistical model that will be described below. The value ED(PI, PO) is assumed to be the predicted delay of the critical path between PI and PO. Static timing analysis of the unit is then performed using ED(PI, PO) and estimated values of Cint(PI) and Reff(PO) to find the predicted critical paths of the unit. This is performed using a typical prior art sequential logic synthesis method.

In order to find the regression equation for calculating estimated delays {ED(PI, PO)}, statistical data is generated that includes the results of applying sequential logic synthesis flow and results of the calculation:

$$\{LD(PI),GD(PI,PO),LD(PI,PO),LD(PO)\}$$

for the same set of "sample CB's." For each pair (PI, PO) valid delay VD(PI, PO) is found and assumed to be the response variable that belongs to observation:

$$\{VD(PI,PO);LD(PI),GD(PI,PO),LD(PI,PO),LD(PO)\}.$$

A set of observations is used to construct a Statistical Model.

Data Groups

A data group is defined as the group of all the data records that have the same vector of delay parameters {LD(PI), GD(PI,PO), LD (PI,PO)}, but different valid delays VD(PI, PO) that correspond to this vector.

Data instability and inability to generate the prediction function for estimation of critical path delay ED (PI,PO) follows from the fact that for the definite vector of delay parameters {LD(PI), GD(PI,PO), LD(PI,PO), LD(PO)} there may exist the set with more that one valid delay {VD(PI,PO)}.

Furthermore, the distribution of valid delays for different data groups is not necessarily the same.

Data Transformation

Data transformation consists of replacing a data group by one vector of delay parameters. Corresponding valid delay (response variable) is calculated as the first moment of the set of valid delays taken from the data group by one vector of delay parameters.

The regression analysis used in one embodiment is SAS's RSREG procedure which gives the second order response surface regression of the data. Based on the above, a complete REG procedure is run with the step function on the full second order polynom. Based on this and a residual analysis, the dependent variable (the delay) does not have a fixed standard deviation (which is one of the basic requirements from a regression model. A Box & Cox methodology is used to transform the dependent variable and to get a good and stable model.

Summary

Thus, to summarize the above methods, the present invention obtained the circuits data from synthesis tools which are well-known in prior art computer-aided and circuit design packages at step 701 of Process 700. Then, at step 702, the data may be analyzed in order to determine the critical paths in the circuit being analyzed. Then, at step 703, a transformational scheme is applied to the data in order to determine which of the critical paths have negative margins. Finally, the regression analysis as described above at step 704 is performed upon the data in order to determine the estimated delays (ED(PI,PO)), in order to actually determine the estimated delay in the system. Upon this determination, critical paths may be determined, and redesigns may be performed upon the circuit in order to make the margins positive, and correct any design errors.

Thus, using the preceding methods for determining critical paths, timing problems may be identified early in the design cycle of a circuit, thus eliminating costly re-designs of such circuits later on. Although there have been some very specific embodiments described in the preceding description, these should be viewed as illustrative only, and the present invention is only to be construed as limited by the appended claims which follow.

We claim:

1. In a computer system, an automatic method of critical path prediction in a network model representative of a circuit, comprising performing the following steps for each combinational block in said network model:

a. determining gate delays for each cell used for each of the drivers in said combinational block by:
      (i) if said cell comprises an AND logical function and a number of outputs of the cell is less than or equal to a Fanin cone for said cell, then computing said gate delay for said cell using an average internal delay for said cell and a capacitance of said cell;
      (ii) if said cell comprises an AND logical function and said number of outputs of said cell exceeds said Fanin cone for said cell then computing said gate delay for said cell using a weighted length of a path from an input to an output of said cell using said average internal delay for said cell and said capacitance of said cell;
      (iii) if said cell comprises an OR logical function and said number of outputs of said cell is less than or equal to said Fanin cone for said cell then computing the gate delay for said cell using the length of the path from an input to an output of said cell; and
      (iv) if said cell comprises an OR logical function and said number of outputs of said cell exceeds said Fanin cone for said cell then computing said gate delay for said cell using said weighted length of a path from an input to an output of said cell using said average internal delay for said cell and said capacitance of said cell;
   b. determining load delays for each cell used for each of said drivers in said combinational block;
   c. determining estimated delays for each path between each of said drivers in said combinational block and sinks coupled to each of said drivers in said combinational blocks; and d. performing a static timing analysis on said combinational block by using said gate delays, said load delays, and said estimated delays to determine estimated required times and total capacitance for each primary output of said sinks of said combinational block, and to determine estimated arrival times for each primary input of said drivers of said combinational block.

2. The method of claim 1 wherein step c. comprises the steps of:

determining accumulated gate delays for each path between each primary input and primary output within said combinational block;

determining accumulated load delays for each said path between each said primary input and said primary output within said combinational block;

using a statistical model to determine an estimated critical path delay between each said path between each said primary input and said primary output within said combinational block.

3. The method of claim 1 wherein the steps of determining said path from said input to said output includes traversing a pre-stored Huffman Tree, wherein nodes in said Huffman Tree are arranged according to cells in said combinational block, and each of said nodes comprise said weights, and times at which signals associated with said nodes become stable, and using said weights and said times to determine a minimum time at which said signal traverses said Huffman Tree.

4. The method of claim 1 wherein step comprises the step of:

summing an internal and an external load capacitance of said drivers.

5. The method of claim 4 wherein said internal load capacitance of said drivers is determined by summing estimated loads for each of said sinks coupled to said drivers within said combinational block.

6. The method of claim 5 wherein if said driver is a primary output of said combinational block, step b. comprises the steps of:

if a capacitance of said primary output is less than or equal to an average parameter of a maximum size simple gate with a minimum number of Fanin inputs then determining said load delay by multiplying a minimum reference by said capacitance of said primary output;

if said capacitance of said primary output is less than or equal to an average parameter of a maximum size simple gate with a maximum number of Fanin inputs then determining said load delay by multiplying said maximum size simple gate with a maximum number of Fanin inputs by said capacitance of said primary output, and further, determining a reference for said primary output by dividing said load delay by said capacitance of said primary output; else, determining said load delay based upon average parameters of a maximum size buffer, and determining a reference for said primary output by dividing said load delay by said capacitance of said primary output.

7. The method of claim 5 wherein said step of summing said estimated loads for each of said sinks coupled to said drivers within said combinational block includes summing an average input capacitance and an average interconnection capacitance of an average cell within said combinational block and the number of sinks coupled to said drivers.

8. The method of claim 5 wherein said load delay is determined by producing a linear sum of said internal load capacitance in said combinational block if said internal load capacitance is less than or equal to the maximum load for a minimum size simple gate with a maximum Fanin number of inputs; otherwise, determining a logarithmic approximation of said load delay using said internal load capacitance, said maximum load for a minimum size simple gate with a maximum Fanin cone number of inputs.

9. The method of claim 8 wherein the production of said linear sum or said logarithmic approximation further includes multiplying said linear sum or said logarithmic approximation by a reference, wherein said reference is determined by the step of:

performing a static timing analysis of said combinational block if said driver is a primary input of said combinational block; otherwise, setting said reference to be equal to a minimum size of a simple gate within said block with a maximum number of Fanin inputs if said driver is an output of an internal gate within said combinational block.

* * * * *

UNITED STATES PATENT AND TRADEMARK OFFICE
CERTIFICATE OF CORRECTION

PATENT NO.  :  5,544,071

DATED  :  August 6, 1996

INVENTOR(S)  :  Keren et al.

It is certified that error appears in the above-identified patent and that said Letters Patent is hereby corrected as shown below:

In column 1 at line 21 delete "modem" and insert --modern--

In column 1 at line 30 delete "results," and insert --result,--

In column 1 at line 59 delete "an" and insert --art--

In column 1 at line 67 delete "driven" and insert --drivers--

In column 4 at line 19 delete "pans." and insert --parts.--

In column 4 at line 35 delete "an" and insert --art--

In column 6 at line 24 delete "an" and insert --art--

In column 6 at line 36 delete "an" and insert --art--

In column 6 at line 39 delete "an" and insert --art--

In column 9 at line 8 delete "pan" and insert --part--

In column 9 at line 23 delete "capacity" and insert --capacitance--

In column 10 at line 41 delete "(PC))" and insert --(PO)--

UNITED STATES PATENT AND TRADEMARK OFFICE
CERTIFICATE OF CORRECTION

PATENT NO. : 5,544,071

DATED : August 6, 1996

INVENTOR(S) : Keren et al.

It is certified that error appears in the above-identified patent and that said Letters Patent is hereby corrected as shown below:

In column 10 at line 62 delete "ED(PI, PC))" and insert --(ED(PI, PO)--

In column 10 at line 65 delete "PI, PC))" and insert --PI, PO--

Signed and Sealed this

First Day of July, 1997

*Attest:*

*Attesting Officer*

BRUCE LEHMAN

*Commissioner of Patents and Trademarks*